(12) United States Patent
Kurganova et al.

(10) Patent No.: US 12,399,428 B2
(45) Date of Patent: Aug. 26, 2025

(54) METHOD AND APPARATUS FOR FORMING A PATTERNED LAYER OF MATERIAL

(71) Applicant: ASML NETHERLANDS B.V., Veldhoven (NL)

(72) Inventors: Evgenia Kurganova, Nijmegen (NL); Gosse Charles De Vries, Veldhoven (NL); Alexey Olegovich Polyakov, Veldhoven (NL); Jim Vincent Overkamp, Eindhoven (NL); Teis Johan Coenen, Vught (NL); Tamara Druzhinina, Eindhoven (NL); Sonia Castellanos Ortega, Leiden (NL); Olivier Christian Maurice Lugier, Amsterdam (NL)

(73) Assignee: ASML NETHERLANDS B.V., Veldhoven (NL)

( * ) Notice: Subject to any disclaimer, the term of this patent is extended or adjusted under 35 U.S.C. 154(b) by 229 days.

(21) Appl. No.: 17/800,649

(22) PCT Filed: Feb. 17, 2021

(86) PCT No.: PCT/EP2021/053852
§ 371 (c)(1),
(2) Date: Aug. 18, 2022

(87) PCT Pub. No.: WO2021/175589
PCT Pub. Date: Sep. 10, 2021

(65) Prior Publication Data
US 2023/0350301 A1    Nov. 2, 2023

(30) Foreign Application Priority Data
Mar. 3, 2020    (EP) ..................... 20160615

(51) Int. Cl.
G03F 7/16    (2006.01)
G03F 7/36    (2006.01)
H01L 21/027    (2006.01)

(52) U.S. Cl.
CPC ............... G03F 7/167 (2013.01); G03F 7/36 (2013.01); H01L 21/027 (2013.01)

(58) Field of Classification Search
CPC ...... G03F 7/0042; G03F 7/0043; G03F 7/167; G03F 7/36; C23C 14/048; C23C 16/047;
(Continued)

(56) References Cited

U.S. PATENT DOCUMENTS

| 4,324,854 | A | 4/1982 | Beauchamp et al. |
| 4,505,949 | A | 3/1985 | Jelks |

(Continued)

FOREIGN PATENT DOCUMENTS

| CN | 102803553 | 11/2012 |
| CN | 104798220 | 7/2015 |

(Continued)

OTHER PUBLICATIONS

International Search Report and Written Opinion issued in corresponding PCT Patent Application No. PCT/EP2021/053852, dated Jul. 9, 2021.

(Continued)

*Primary Examiner* — Deoram Persaud
(74) *Attorney, Agent, or Firm* — Pillsbury Winthrop Shaw Pittman, LLP

(57) ABSTRACT

Methods and apparatus for forming a patterned layer of material are disclosed. In one arrangement, a deposition-process material is provided in gaseous form. A layer of the deposition-process material is formed on the substrate by causing condensation or deposition of the gaseous deposition-process material. A selected portion of the layer of (Continued)

deposition-process material is irradiated to modify the deposition-process material in the selected portion.

20 Claims, 8 Drawing Sheets

(58) Field of Classification Search
CPC ............ C23C 16/26; C23C 16/45536; C23C 16/45544; C23C 16/463; C23C 16/482; C23C 16/483; C23C 16/487; C23C 16/56; H01J 2237/31732; H01J 2237/31735; H01L 21/02521; H01L 21/02527; H01L 21/02568; H01L 21/0259; H01L 21/02631; H01L 21/02664; H01L 21/027
See application file for complete search history.

(56) References Cited

U.S. PATENT DOCUMENTS

| | | | | |
|---|---|---|---|---|
| 4,892,751 | A * | 1/1990 | Miyake | C23C 16/483 427/586 |
| 5,769,950 | A * | 6/1998 | Takasu | C23C 16/52 118/725 |
| 5,962,194 | A * | 10/1999 | Komatsu | H01L 21/0332 430/394 |
| 6,952,253 | B2 | 10/2005 | Lof et al. | |
| 2002/0066411 | A1 | 6/2002 | Chiang et al. | |
| 2005/0249887 | A1* | 11/2005 | Dando | C23C 16/047 427/532 |
| 2011/0269298 | A1* | 11/2011 | Holme | C23C 16/487 977/773 |
| 2014/0268082 | A1* | 9/2014 | Michaelson | G03F 7/167 118/725 |
| 2017/0137943 | A1* | 5/2017 | Mohn | H01L 21/68764 |
| 2022/0213593 | A1* | 7/2022 | Druzhinina | G03F 7/0042 |
| 2023/0136483 | A1* | 5/2023 | Hendriks | C23C 28/00 428/212 |

FOREIGN PATENT DOCUMENTS

| | | |
|---|---|---|
| EP | 0184352 | 11/1985 |
| KR | 2015-0132417 | 11/2015 |
| TW | 201439361 | 10/2014 |
| TW | 201734258 | 10/2017 |

OTHER PUBLICATIONS

|Taiwanese Office Action issued in corresponding Taiwanese Patent Application No. 110107460, dated Oct. 18, 2021.
Hill, S.B et al.: "Optics contamination studies in support of high-throughput EUV lithography tools", Proc. of SPIE, vol. 7969 (Mar. 25, 2011).
Office Action issued in corresponding Korean Patent Application No. 10-2022-7029954, dated Mar. 24, 2024.
Office Action issued in corresponding Chinese Patent Application No. 202180018817.X, dated Jan. 24, 2024.
Office Action issued in corresponding Chinese Patent Application No. 202180018817, dated Aug. 9, 2024.

* cited by examiner

METHOD AND APPARATUS FOR FORMING A PATTERNED LAYER OF MATERIAL

CROSS-REFERENCE TO RELATED APPLICATIONS

This application is the U.S. national phase entry of PCT Patent Application No. PCT/EP2021/053852 which was filed on Feb. 17, 2021, which claims the benefit of priority of European Patent Application No. 20160615.9 which was filed on Mar. 3, 2020 and which is incorporated herein in its entirety by reference.

FIELD

The present invention relates to methods and apparatus for forming a patterned layer of material.

BACKGROUND

As semiconductor manufacturing processes continue to advance, the dimensions of circuit elements have continually been reduced while the amount of functional elements, such as transistors, per device has been steadily increasing, following a trend commonly referred to as 'Moore' s law'. To keep up with Moore's law the semiconductor industry is seeking technologies that enable creation of increasingly smaller features.

Various deposition technologies exist for fabricating two-dimensional materials. Such deposition technologies include chemical vapor deposition (CVD) and atomic layer deposition (ALD) for example. There is interest in using such deposition technologies to form device structures such as circuit elements as part of semiconductor manufacturing processes. It has proven difficult to achieve acceptably high throughput. It is difficult for example to configure deposition processes such as CVD and ALD so that deposition occurs quickly in a desired pattern while maintaining high quality in the deposited material.

SUMMARY

It is an object of the invention to provide alternative or improved ways of forming patterned layers.

According to an aspect, there is provided a method of forming a patterned layer of material, comprising: providing a deposition-process material in gaseous form; forming a layer of the deposition-process material on the substrate by causing condensation or deposition of the gaseous deposition-process material; and irradiating a selected portion of the layer of deposition-process material to modify the deposition-process material in the selected portion.

Thus, a method is provided which forms a liquid or solid layer of a deposition-process material (e.g. a precursor material for a deposition process) from a gas. The gas may be provided for example at a pressure close to or at a saturated vapour pressure. The layer is then modified in a selected portion by exposure to radiation as part of a deposition process. Irradiating the layer in the liquid or solid state significantly increases a deposition rate and/or decreases a required radiation dose, in comparison to alternative radiation-induced deposition processes involving gaseous precursors. Forming the liquid or solid layer from a gas in situ allows the layer to be provided with a suitable thickness in a controlled manner. The formation of the layer from a gas also facilitates removal of un-modified material from the layer after the irradiation. This can be achieved, for example, by reversing the thermodynamic conditions that were used to promote the formation of the liquid or solid layer (e.g. by reducing the partial pressure of the gas or by warming the substrate). No separate processing steps (e.g. etching, rinsing, cleaning) are required to remove the unmodified material. The approach allows patterns to be formed on complex architectures directly, without the need of filling steps or use of sacrificial components. Further processing steps (e.g. exposing of a subsequent layer) may be performed without moving the substrate to a different substrate table or processing apparatus, thereby improving overlay errors.

In an embodiment, the forming of the layer of the deposition-process material is at least partly achieved by applying a cooling process to the substrate to maintain the substrate below an ambient temperature. The cooling of the substrate means that the deposition-process material will condense or deposit preferentially on the substrate W relative to other elements with which the gaseous deposition-process material may be in contact, thereby reducing or eliminating unwanted contamination of other elements (e.g. optical elements) by condensation or deposition of the deposition-process material onto them.

According to an aspect, there is provided a method of forming a patterned layer of material, comprising: providing a substrate in a chamber; supplying a gas of deposition-process material to the chamber at a temperature higher than the substrate, a temperature difference between the substrate and the gas being such as to cause a high-density gaseous layer of deposition-process material to form next to the substrate, the high-density gaseous layer of deposition-process material having a higher density than the gas of deposition-process material in other regions of the chamber; and irradiating a selected portion of the layer of deposition-process material to modify the deposition-process material in the selected portion.

Thus, a method is provided which forms a high-density gaseous layer of a deposition-process material (e.g. a precursor material for a deposition process) from a lower density gas. The layer is then modified in a selected portion by exposure to radiation as part of a deposition process. Irradiating the layer in the high-density state significantly increases a deposition rate and/or decreases a required radiation dose, in comparison to alternative radiation-induced deposition processes involving lower density gaseous precursors, with low or no risk of contamination due to unwanted condensation of the deposition-process material on sensitive apparatus elements.

In an embodiment, the irradiation of the selected portion is performed using radiation having a wavelength of less than 100 nm. Using such low wavelength radiation allows high resolutions to be achieved, as well as providing efficient driving of a range of deposition processes promoted by secondary electrons. At such wavelengths, the photons are mainly absorbed by the substrate, so there is less or no requirement for the deposition-process material itself to have high absorption. This broadens the choice of composition for the deposition-process material (e.g. precursor for deposition).

In an embodiment, the irradiation of the selected portion is performed using an electron beam. The provision of the high-density gas, liquid or solid layer of deposition-process material helps to maximise throughput, which can otherwise be a challenge in processes relying on electron beam-based irradiation.

According to an aspect, there is provided an apparatus for forming a patterned layer of material, comprising: an environment control system configured to control the composition of an environment above a substrate; an irradiation system; and a control system configured to control the environment control system and the irradiation system to: form a layer of a deposition-process material on the substrate by causing condensation or deposition of the deposition-process material from a gas; and irradiate a selected portion of the formed layer of deposition-process material to modify the deposition-process material in the selected portion.

According to an aspect, there is provided an apparatus for forming a patterned layer of material, comprising: an environment control system configured to control the composition of an environment above a substrate in a chamber; an irradiation system; and a control system configured to control the environment control system and the irradiation system to: supply a gas of deposition-process material to the chamber at a temperature higher than the substrate, a temperature difference between the substrate and the gas being such as to cause a high-density gaseous layer of deposition-process material directly to form next to the substrate, the high-density gaseous layer of deposition-process material having a higher density than the gas of deposition-process material in other regions of the chamber; and irradiate a selected portion of the formed layer of deposition-process material to modify the deposition-process material in the selected portion.

BRIEF DESCRIPTION OF THE DRAWINGS

Embodiments of the invention will now be described, by way of example only, with reference to the accompanying schematic drawings, in which.

DETAILED DESCRIPTION

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus which uses extreme ultraviolet (EUV) radiation, having a wavelength of less than 100 nm, optionally in the range of 5-100 nm, optionally within a range of 4 nm to 20 nm, for example 6.7 nm or 13.5 nm, may be used to form smaller features on a substrate than a lithographic apparatus which uses, for example, radiation with a wavelength of 193 nm.

In the present document, the terms "radiation" and "beam" are used to encompass all types of electromagnetic radiation unless stated otherwise, including ultraviolet radiation (e.g. with a wavelength of 365, 248, 193, 157 or 126 nm) and EUV (extreme ultra-violet radiation, e.g. having a wavelength in the range of about 5-100 nm), as well as electron beam radiation.

Figure 1:
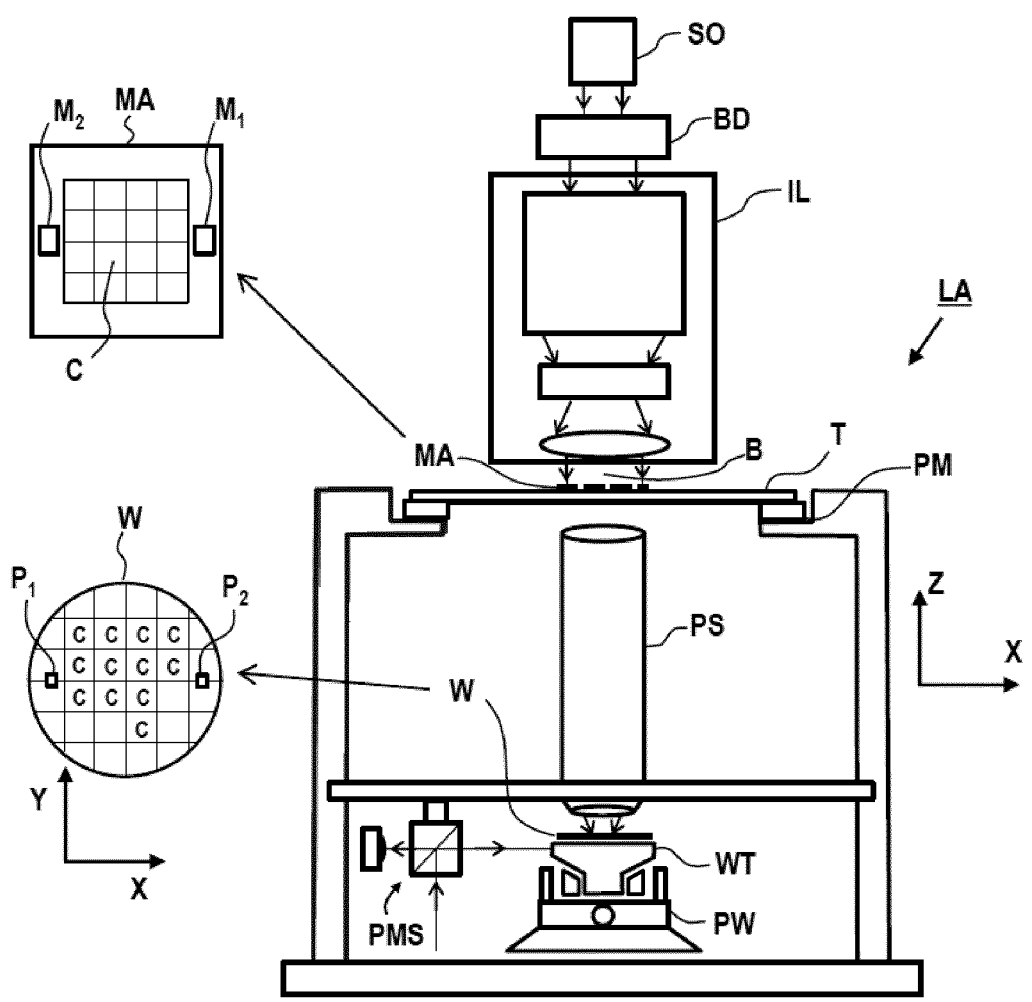
FIG. 1 depicts a first example of a lithographic system comprising a lithographic apparatus and a radiation source.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
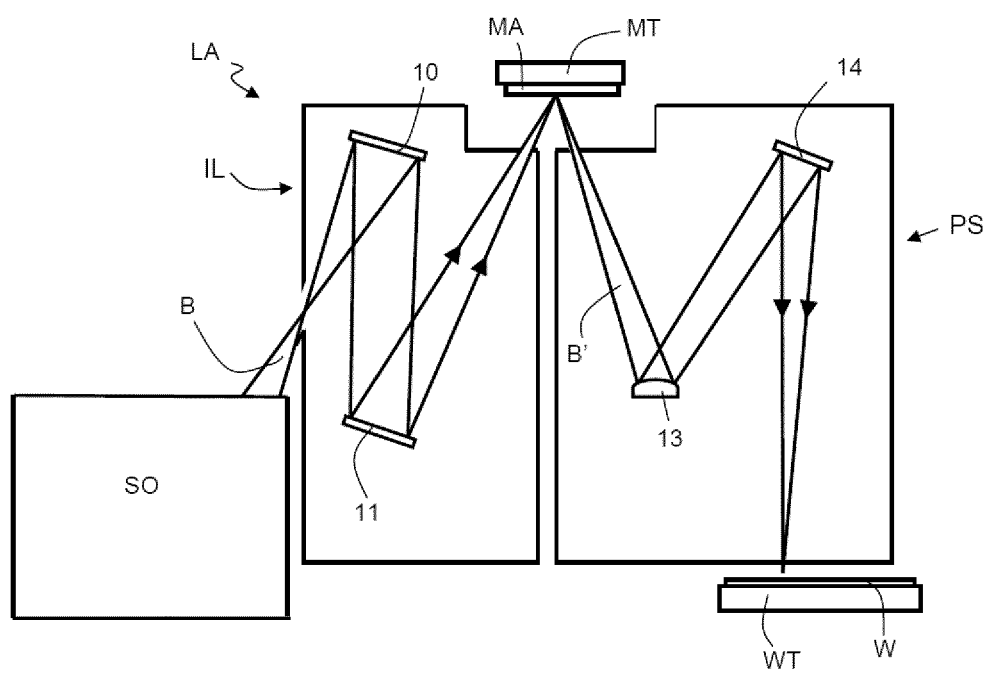
FIG. 2 depicts a second example of a lithographic system comprising a lithographic apparatus and a radiation source.

FIG. 2 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 2, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

As mentioned in the introductory part of the description, although there is interest in using deposition technologies such as CVD or ALD to fabricate two-dimensional materials as part of a semiconductor manufacturing process, it has proven difficult to achieve high throughput. Embodiments described below address this and/or other issues to thereby provide alternative and/or improved ways of forming patterned layers of material.

Figure 3:
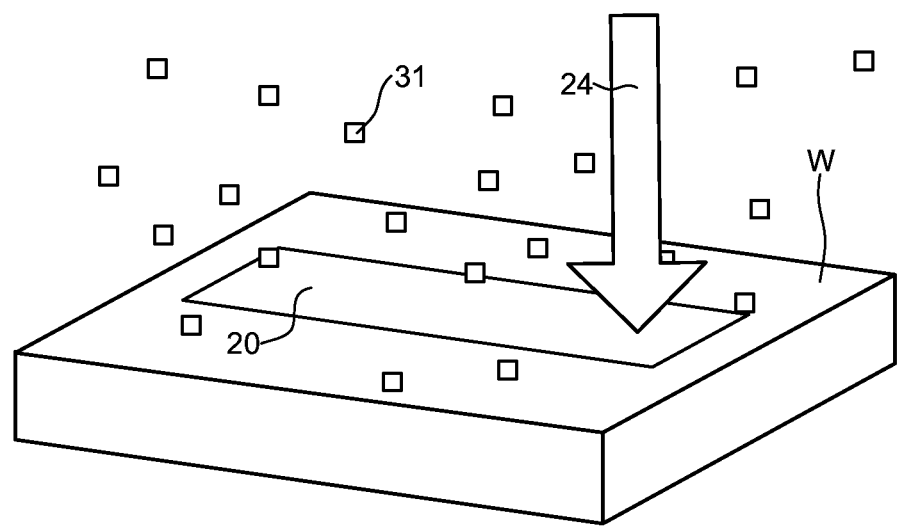
FIG. 3 schematically depicts irradiation of a selected portion on a substrate during a first step of an atomic layer deposition process.
Figure 4:
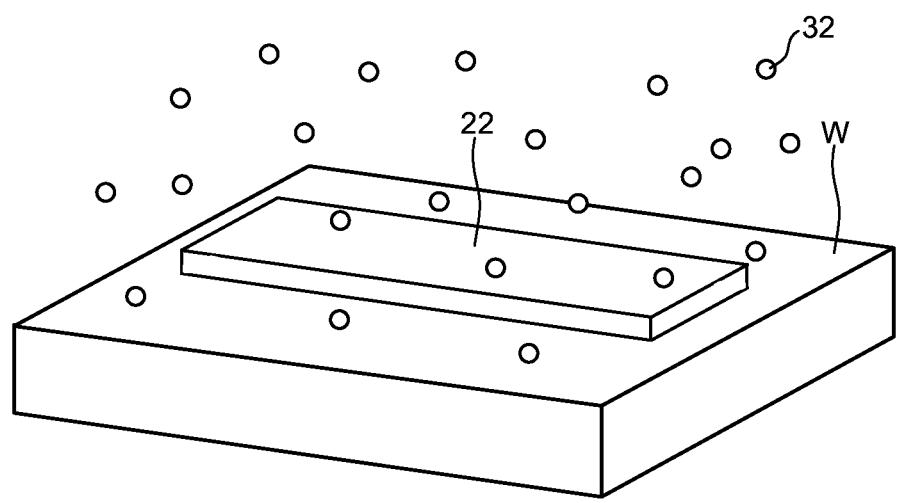
FIG. 4 schematically depicts a step in the atomic layer deposition process subsequent to the step depicted in FIG. 3.

Embodiments of the disclosure provide methods of forming a patterned layer of material 22 based on irradiating 24 a selected portion 20 of a substrate W, as depicted schematically in FIGS. 3 and 4. The size and shape of the selected portion 20 defines the pattern of the patterned layer of material 22 (e.g. by defining the presence or absence of a desired material in the patterned layer of material 22. A simple rectangle is depicted for ease of illustration, but it will be understood that arbitrarily complex patterns can be formed subject to resolution limits of the irradiation system being used.

The irradiation may define the pattern to be formed by driving a deposition process in the selected portion 20 and not elsewhere. In an embodiment, the deposition process is configured to form a monolayer (or multiple monolayers if the deposition process is repeated). In an embodiment, the deposition process comprises an atomic layer deposition process. In other embodiments, a different deposition process or combination of deposition processes is used, including for example one or more of the following independently or in combination: atomic layer deposition; chemical vapor deposition; plasma-enhanced chemical vapor deposition; epitaxy; sputtering; and electron beam-induced deposition. The formation of the patterned layer of material 22 may constitute a step in a method of forming at least one layer of a device to be manufactured, such as a semiconductor device.

In an embodiment, the irradiation is performed with radiation that is capable of locally driving the deposition process. In an embodiment, the radiation comprises, consists essentially of, or consists of any type of EUV radiation (having a wavelength less than 100 nm) that is capable of locally driving the deposition process. The use of EUV radiation provides high spatial resolution. In an embodiment, the radiation comprises, consists essentially of, or consists of an electron beam (e.g., encompassing one or more focused and/or patterned beams provided by single beam or multi-beam systems). In some embodiments, the irradiation (e.g. using EUV radiation and/or electron beam radiation) is performed in combination with other forms of radiation, including one or more of the following: an electron beam; radiation having a wavelength in the range of 100 nm to 400 nm (including DUV radiation); and laser radiation. Driving of the deposition process by EUV radiation often occurs predominantly by the EUV radiation interacting with solid material (e.g. the substrate W or layers formed on the substrate W) to liberate electrons from the solid material. The liberated electrons drive chemical reactions involved with the deposition process. Using an e-beam in combination with the EUV radiation provides a high concentration of electrons and/or further contributes to breaking bonds to create reactive species, thereby promoting faster deposition of material.

The irradiation locally drives the deposition process in the selected portion 20 and thereby causes the formation of a layer of deposited material 22 (see FIG. 4) in a pattern defined by the selected portion 20. A pattern is thus formed without needing any resist. No processing to remove a resist is therefore required, which reduces the risk of damage to the patterned layer of material 22 or to any fragile underlying materials. This approach is particularly desirable where resist residue could significantly impact properties of a fragile underlying material and/or where lift-off of resist could significantly damage a fragile underlying material. Examples of fragile underlying materials include very thin film coatings, 2D materials such as graphene or transitional metal dichalcogenides (TMD), and free-standing membranes or thin films. In contrast to traditional lithography-based semiconductor manufacturing processes, instead of being used to modify resist material, radiation is being used to drive one or more chemical reactions involved in the deposition process.

Atomic layer deposition is a known thin-film deposition technique in which each of at least two chemicals (which may be referred to as precursor materials) are made to react with the surface of a material in a sequential, self-limiting, manner. In contrast to chemical vapor deposition, the two precursor materials are not normally present simultaneously above the substrate W.

In at least some embodiments using atomic layer deposition as the deposition process, the atomic layer deposition comprises at least a first step and a second step. In the first step, an example of which is depicted in FIG. 3, a first precursor material 31 is made to react with a surface of a substrate W. In the second step, an example of which is depicted in FIG. 4, a second precursor material 32 is made to react with the substrate W in a region where the first precursor 31 reacted with the substrate W in the first step (in this example the selected portions 20). In the example of FIGS. 3 and 4, the substrate W is irradiated in the first step only of the atomic layer deposition. In other embodiments, the irradiation is performed during the second step only or during the first step and the second step. In embodiments not involving immersion liquid, the irradiation in at least one of the two steps is performed using EUV radiation. Irradiation may additionally be performed in one or more other steps using other forms of irradiation (with or without an immersion liquid), including DUV radiation.

Embodiments of the disclosure involve driving of a deposition process using radiation. The deposition process typically involves deposition of a solid material derived from a deposition-process material that is initially provided in gaseous form. In the example of FIGS. 3 and 4, the first precursor material 31 is an example of such a deposition-process material. Further details are given below about how deposition of material derived from gaseous deposition-process material can be achieved with high efficiency (e.g. with lower doses of radiation for a given thickness of deposited material).

Figure 5:
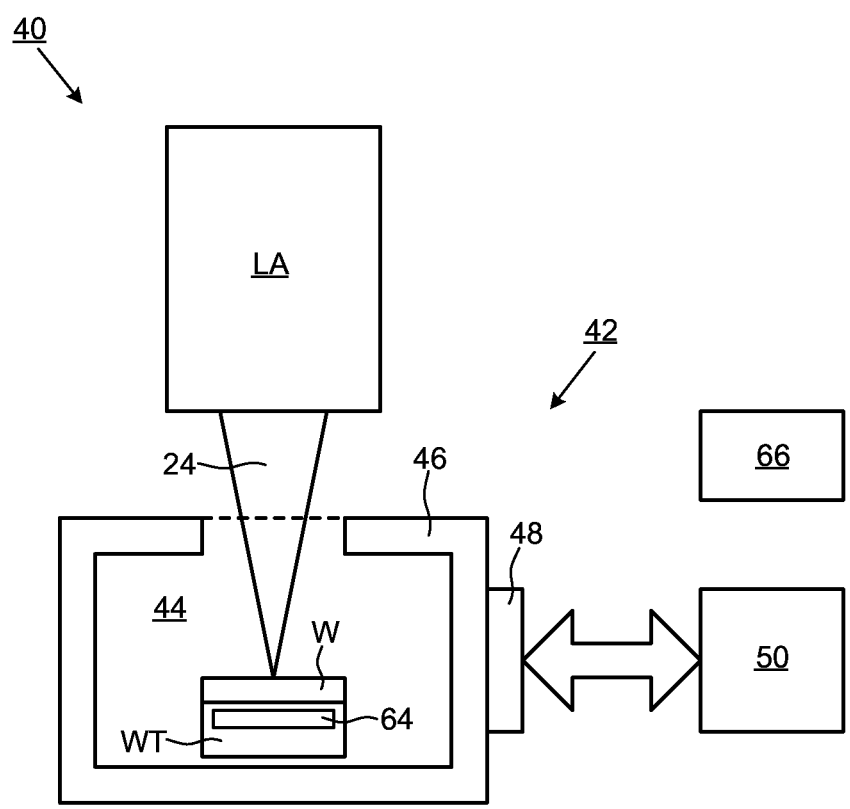
FIG. 5 schematically depicts a lithographic apparatus providing radiation to an environment control system according to an embodiment.

FIG. 5 schematically depicts an apparatus 40 for performing the method. The apparatus 40 thus forms a patterned layer of material 22. The apparatus 40 comprises an irradiation system. In the example shown, the irradiation system comprises a lithographic apparatus LA. The lithographic apparatus LA projects a patterned radiation beam from a patterning device MA onto the substrate W. The lithographic apparatus LA may be configured as described above with reference to FIG. 1 (e.g. when the irradiation comprises DUV radiation and/or immersion lithography is required) or as described above with reference to FIG. 2 (e.g. when the irradiation comprises EUV radiation).

The apparatus 40 further comprises an environment control system 42. The environment control system 42 allows the composition of an environment 44 above the substrate W to be controlled in such a way as to allow the deposition process (e.g. atomic layer deposition process) to proceed. In an embodiment, the environment control system 42 comprises a chamber 46 to seal the environment 44 from ambient conditions outside of the chamber 46. In some embodiments, all of the substrate W will be within the chamber 46 during the deposition process. In an embodiment, a materials exchange system 48 (e.g. a port into the chamber 46 and associated valves and/or conduits) is provided that allows materials to be added to and removed from the sealed environment 44 to allow different compositional environments to be established within the sealed environment 44. Materials may be provided to and from the materials exchange system 48 by a flow manager 50. The flow manager 50 may comprise any suitable combination of reservoirs, ducting, valves, sinks, pumps, control systems, temperature control systems (e.g. heaters and/or coolers) and/or other components necessary to provide the required flows of materials into and out of the chamber 46. The different compositional environments achieved in this way may correspond to different respective stages of an atomic layer deposition process. In some embodiments, the materials added to and removed from the chamber 44 are gaseous, thereby providing compositional environments consisting of different combinations of gases. In an embodiment in which one or more steps of the deposition process are performed by irradiating the substrate W through an immersion liquid, the environment control system 42 may be configured to allow switching between a state in which a controlled liquid environment is maintained above the substrate W (e.g. during exposure in an immersion lithography mode) and a state in which a controlled gaseous environment is maintained above the substrate W (e.g. during adsorption of a precursor from a gaseous precursor material).

In some embodiments, the compositional environment is controlled to provide different mixtures of gases at different times. The different mixtures of gases may be provided to deposit different materials or to switch between a mode where material is deposited and a mode in which material is etched away. The different mixtures of gases may also be used to controllably vary a rate of deposition as a function of time, which may be useful for example to create features with well-defined edges and/or shapes.

In some embodiments, the driving of the deposition process comprises driving a chemical reaction involving a precursor material. The precursor material will be provided as part of the compositional environment established above the substrate W during the irradiation. The driving of the chemical reaction may cause the chemical reaction to proceed at a faster rate than would be the case in the absence of the irradiation. Alternatively, the chemical reaction may be such that it would not occur at all in the absence of the irradiation. In an embodiment, the chemical reaction is endothermic and the irradiation provides the energy necessary to allow the chemical reaction to proceed. In some embodiments, the chemical reaction is at least partially driven by heat generated in the substrate W by the irradiation. Thus, the chemical reaction being driven by the irradiation may comprise a chemical reaction that requires an elevated temperature to proceed or which proceeds more rapidly at elevated temperatures. In some embodiments, the chemical reaction comprises a photochemical reaction driven by the irradiation. Thus, at least one species involved in the chemical reaction directly absorbs a photon from the irradiation and the absorption of the photon allows the chemical reaction to proceed. In some embodiments, the photochemical reaction comprises a multi-photon photochemical reaction involving absorption of two or more photons by each of at least one species involved in the photochemical reaction. The requirement for two or more photons to be absorbed makes the chemical reaction much more sensitive to variations in the intensity of the irradiation (i.e. the rate of the chemical reaction varies much more strongly as a function of intensity) than would be the case for single photon photochemical reactions. The increased sensitivity to intensity provides improved lateral contrast. In an embodiment, a combination of a photochemical reaction and radiation induced heating is used to provide a well-defined process window in which the chemical reaction is driven locally to produce the pattern. In an embodiment, the chemical reaction is driven by a plasma generated by interaction between the radiation and the substrate W, a layer formed on the substrate W, and/or a gas present above the substrate. In an embodiment, the generated plasma is generated in a localized region defined by the irradiation. In an embodiment, the chemical reaction is driven by electrons provided by the irradiation. The electrons may comprise photoelectrons or secondary electrons (electrons generated by inelastic scattering events of a photoelectron or of electrons from an e-beam). In an embodiment, photons absorbed by the substrate W may provide energetic electrons near the surface of the substrate W that participate in the deposition process. In embodiments where a combination of electromagnetic radiation and an e-beam is used, a portion of the deposition process may be driven by electrons from the e-beam.

A challenge with approaches such as those described above is that the radiation dose needed to form a required thickness of material can be very high. The reasons for this and solutions to the challenge are described below.

Deposition of a nominal thickness $T_{nom}$ requires a nominal radiation dose $D_{nom}$. At a given radiation-induced deposition rate $R_{dep}$ and radiation intensity $I_{rad}$:

$$T_{nom} = R_{dep} \times t_{nom} = R_{dep} \times D_{nom}/I_{rad}$$

where $t_{nom}$ is a nominal deposition time, and from which it follows that $$D_{nom} = T_{nom} \times I_{rad}/R_{dep}$$

The nominally required dose $D_{nom}$ can therefore be decreased by increasing the radiation-induced deposition rate $R_{dep}$. To a first order approximation, the radiation-induced deposition rate can be described by the following:

$$R_{dep} \sim I_{rad} \times \eta_{SE} \times \xi_{SE} \times \sigma_{SE-p} \times \rho_p \times M_p$$

where:

$\eta_{SE}$ represents the yield of secondary electrons (SE) near the substrate surface inside and outside of the bulk of the substrate W. $\eta_{SE}$ depends on the EUV absorption of the substrate W and the nature of the substrate material. The higher the EUV absorption the higher the yield $\eta_{SE}$.

$\xi_{SE}$ represents the portion of the secondary electrons generated in the substrate W that come into contact with deposition-process material above the substrate W. $\xi_{SE}$ depends on the phase of the deposition-process material: $\xi_{SE}$ is lower when the deposition-process material is in the gaseous state and higher when the deposition-process material is in the solid or liquid phase.

$\sigma_{SE-p}$ represents a reaction cross-section for reaction between secondary electrons and deposition-process material. $\sigma_{SE-p}$ depends on secondary electron kinetic energies and dissociation energies of molecules of the deposition-process material.

$\rho_p$ represents a local surface density of the deposition-process material at the substrate W.

$M_p$ represents a molecular weight of the deposition-process material or portion of the deposition-process material that remains intact after interaction with the secondary electrons and is deposited on the substrate W.

In principle, the radiation-induced deposition rate $R_{dep}$ can be increased by increasing any of the parameters $I_{rad}$, $\eta_{SE}$, $\xi_{SE}$, $\sigma_{SE-p}$, $\rho_p$, $M_p$. $I_{rad}$ cannot be increased indefinitely because the radiation will eventually cause unacceptable damage to the substrate W or previously deposited layers on the substrate W. In embodiments of the present disclosure described below, methods are provided that increase the radiation-induced deposition rate $R_{dep}$ by changing a phase of the deposition-process material from a gas to a liquid or solid during the irradiation, or by providing a high-density gaseous layer of the deposition-process material next to the substrate W, all of which result in a large increase in $\rho_p$ and $\xi_{SE}$.

It is intuitive that increasing the density $\rho_p$ of deposition-process material increases the number of molecules interacting with the secondary electrons.

Figure 6:
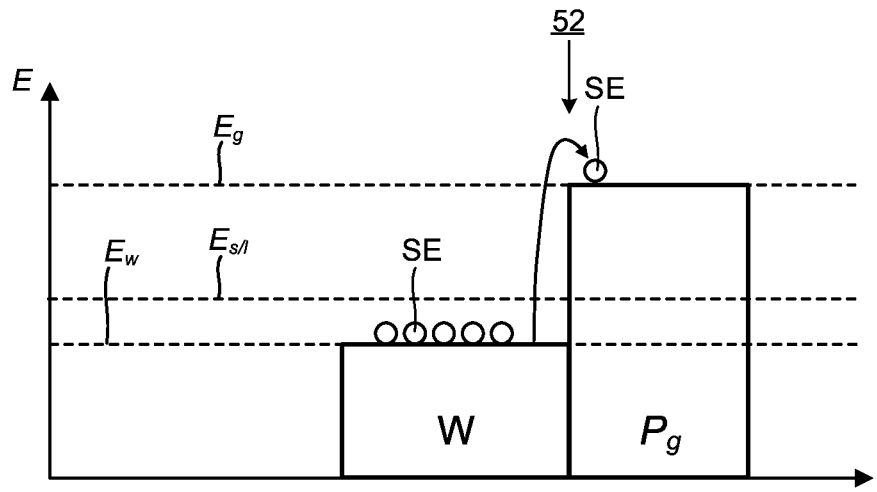
FIG. 6 is an energy diagram schematically depicting a potential barrier for secondary electrons escaping from a solid substrate to a gaseous environment above the substrate.
Figure 7:
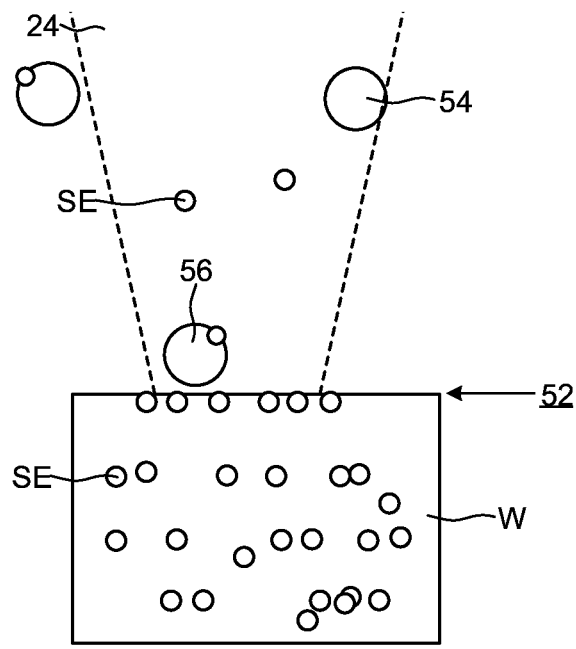
FIG. 7 is a schematic side sectional view of a substrate with deposition-process material provided in gaseous form above the substrate.
Figure 8:
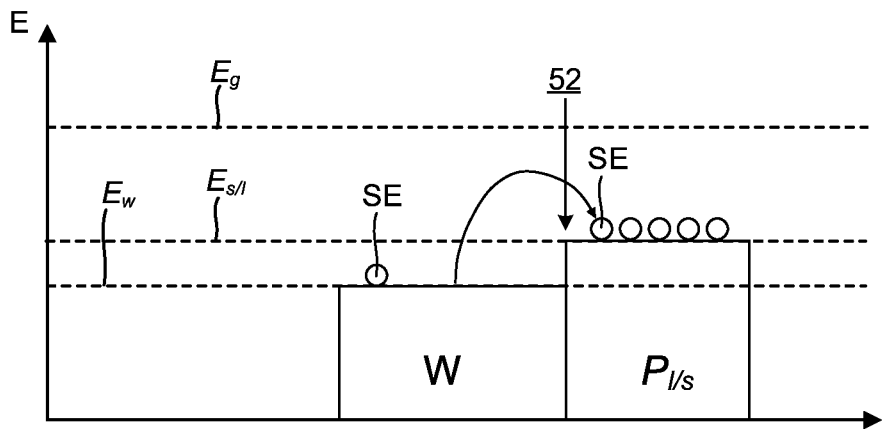
FIG. 8 is an energy diagram schematically depicting a potential barrier for secondary electrons escaping from a solid substrate to a high density layer of deposition-process material above the substrate.
Figure 9:
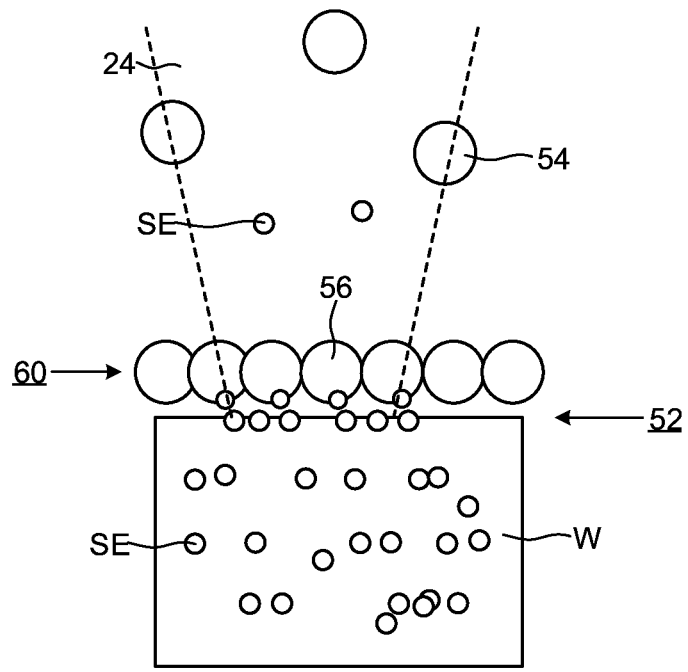
FIG. 9 is a schematic side sectional view of a substrate with deposition-process material provided in a high density layer above the substrate.

The effect of the change of phase on $\xi_{SE}$ can be understood phenomenologically as described below, making reference to FIGS. 6-9. FIGS. 6 and 7 schematically depict a case where the deposition-process material $P_g$ is in gaseous form. FIGS. 8 and 9 schematically depict a case where the deposition-process material $P_{s/t}$ is in liquid or solid form. FIGS. 6 and 8 are energy diagrams with the vertical axis representing energy E. FIGS. 7 and 9 are schematic side sectional views of the substrate W with deposition-process material $P_g/P_{s/t}$ provided above the substrate W in gaseous or solid/liquid form. The horizontal axes in FIGS. 6 and 8 and the vertical direction in FIGS. 7 and 9 schematically represent a variation of position spanning an interface 52 between the solid substrate W and the deposition-process material $P_g/P_{s/t}$. Small circles in each figure represent secondary electrons. The larger circles in FIGS. 7 and 9 schematically represent molecules 54 of the deposition-process material. Molecules 56 of the deposition-process material that have been modified by the irradiation are schematically shown as a combination of a large circle and a small circle in FIGS. 7 and 9.

The factor $\xi_{SE}$ depends on how many secondary electrons generated in the substrate W can come into contact with the deposition-process material, which depends on the difference between their Fermi energies.

As depicted in FIGS. 6 and 7, when the deposition-process material $P_g$ is in the gaseous state, the relevant difference in energy is between the Fermi energy $E_W$ in the solid substrate W and the vacuum level $E_g$, which is relatively large. The large difference in energy means relatively few secondary electrons are made available to drive the deposition process by interacting with the deposition-process material $P_g$. Only secondary electrons that can overcome the potential barrier between the substrate Fermi energy $E_W$ and vacuum level $E_g$, which may also be referred to as the work function (and is typically ~4 eV), can escape the substrate W and interact with the deposition-process material $P_g$. $\xi_{SE}$ is therefore small when the deposition-process material $P_g$ is provided in the gaseous state.

As depicted in FIGS. 8 and 9, when the deposition-process material $P_{s/t}$ is in the solid or liquid phase, the secondary electrons transfer from the Fermi energy $E_W$ in the solid substrate W to the Fermi energy $E_{s/t}$ in the deposition-process material $P_{s/t}$. The difference in energy between $E_W$ and $E_{s/t}$ is much lower than the work function. The difference in energy between $E_W$ and $E_{s/t}$ can also be tuned by suitable selection of the substrate material and the deposition-process material $P_{s/t}$ to be small (as shown in FIG. 8) or even negative (not shown). In the negative case, it is energetically favourable for electrons to propagate from the substrate W to the deposition-process material $P_{s/t}$. In both cases, the provision of a deposition-process material $P_{s/t}$ in the solid or liquid phase means that a much larger proportion of the secondary electrons are able to come into contact with molecules of the deposition-process material $P_{s/t}$ and thereby contribute to the deposition process involving the deposition-process material $P_{s/t}$ (e.g. by modifying them to produce the modified molecules 56). It can already be seen from FIGS. 7 and 9 that the density $\rho_p$ of deposition-process material is already larger in the case of FIG. 9 relative to FIG. 7. For the above-described reasons, $\xi_{SE}$ is also expected to be considerably larger. The net result is that providing the deposition-process material in solid or liquid form is expected to considerably increase the radiation-induced deposition rate $R_{dep}$ in comparison to the case where the deposition-process material is provided in the gaseous state only.

Figure 10:
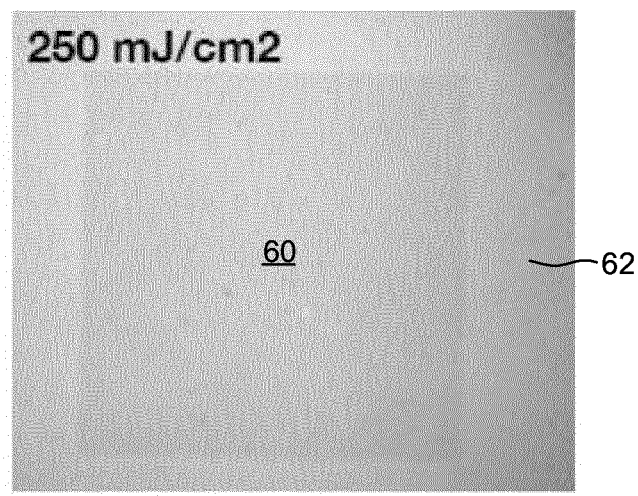
FIG. 10 is an optical microscope image of a rectangular area exposed by EUV radiation during a test procedure.
Figure 11:
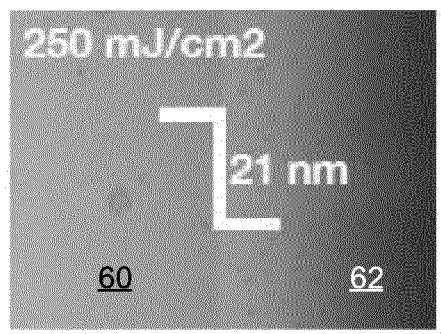
FIG. 11 is an optical microscope image of a portion of a boundary of the rectangular area indicating optical contrast and a step height across the boundary between the interior of the rectangular region where radiation-induced deposition has occurred and the outside of the rectangular region where radiation-induced deposition has not occurred.
Figure 13:
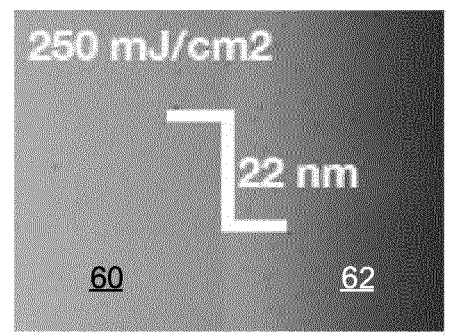
FIG. 13 is an optical microscope image of a further portion of the boundary showing similar optical contrast and step height to that observed in FIG. 11.
Figure 12:
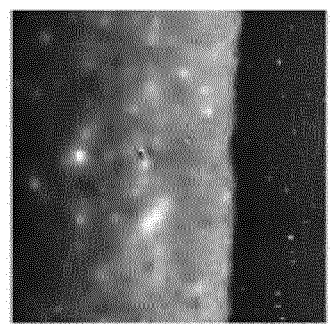
FIG. 12 is an atomic force microscope image of the portion of the boundary shown in FIG. 11.
Figure 14:
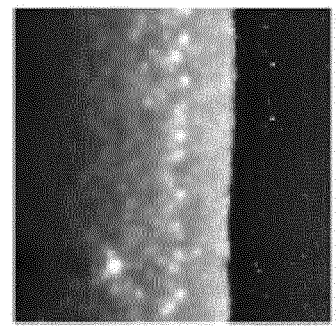
FIG. 14 is an atomic force microscope image of the portion of the boundary shown in FIG. 13.

The size of the above effect has been demonstrated by an unpublished contamination accident during exposure of a layer of gold in a test procedure. The test procedure comprised exposure of the gold by EUV radiation at a dose of 250 mJ/cm². The exposure was performed while the substrate was cooled cryogenically to 125K. Contaminant gases containing carbon compounds were accidentally present in the test chamber during the exposure and were caused to condense onto the test substrate due to the low temperature of the substrate. FIG. 10 depicts an image obtained from an optical microscope of a rectangular area 60 exposed by EUV radiation. The area 62 surrounding the rectangular area 60 was not exposed by the EUV radiation. FIG. 11 is a magnified optical image of a portion of the boundary of the rectangular area showing an optical contrast across the boundary. FIG. 12 shows an atomic force microscope (AFM) image of the same portion of the boundary and indicates a step in height of 21 nm. FIGS. 13 and 14 show corresponding images for a different portion of the boundary and indicate a similar step height of 22 nm. Thus, the EUV radiation induces growth of a uniformly thick layer of material having a thickness of about 20 nm from the condensed carbon-containing contaminant gases. The thickness of 20 nm was deposited with a dose of 250 mJ/cm². According to the literature, in similar experiments performed at room temperature with low pressure gaseous precursor material, deposition of about 10 nm of carbon contamination required a dose of about 100 J/cm² or even more (see for example Proc. of SPIE Vol. 7969 79690M 2011). Therefore changing the phase of the precursor material from a gas to a liquid is seen to decrease the required EUV dose by a factor of about 1000.

In the discussion above making reference to FIGS. 6-14, example cases of irradiating a selected portion of a layer of deposition-process material that is temporarily in liquid or solid form on the substrate W were described. In other embodiments, a layer of a high-density gaseous form of the deposition-process material is irradiated instead. The high-density state increases the density $\rho_p$ of deposition-process material in the layer and thereby increases the number of molecules interacting with the secondary electrons. The high-density state may also increase the factor $\xi_{SE}$ by decreasing the energy barrier for secondary electrons generated in the substrate W to come into contact with the deposition-process material in a way analogous to the mechanism described above with reference to FIGS. 6-9.

Figure 15:
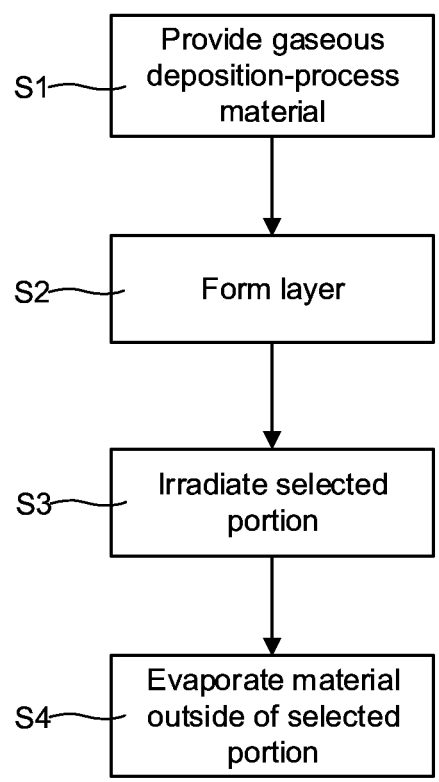
FIG. 15 is a flow chart depicting an example method of forming a patterned layer of material.

FIG. 15 is a flow chart depicting an example method of forming a patterned layer of material based on the above insight. The method improves the radiation-induced deposition rate $R_{dep}$. The method may be performed using the apparatus 40 for forming a patterned layer of material described above with reference to FIG. 5. A control system 66 may be provided for controlling the apparatus 40 to perform the method steps described below.

In a first step S1, a deposition-process material is provided in gaseous form. The deposition-process material may comprise a precursor for a deposition process that is locally driven by irradiation. The deposition-process material is not necessarily limited to this. The deposition-process material may be any material which contributes to the radiation-induced deposition process being considered, including for example materials considered as co-reactants and/or catalysts. The deposition-process material may be provided to a chamber 46 containing the substrate W.

In a subsequent step S2, a layer 60 of the deposition-process material is formed on the substrate W, as depicted schematically in FIG. 9. The layer 60 may be formed by causing condensation (transformation from a gaseous state to a liquid state) or deposition (transformation from a gaseous state to a solid state) of the gaseous deposition-process material onto the substrate W. Alternatively, the layer 60 may be formed by supplying a gas of deposition-process material to the chamber 46 at a temperature higher than the substrate W and arranging for the temperature difference between the substrate W and the gas to be such as to cause the layer 60 to be formed as a high-density gaseous layer of deposition-process material next to the substrate W. The gaseous layer 60 of deposition-process material has a higher density than the gas of deposition-process material in other regions of the chamber 46 in embodiments of this type.

In an embodiment, the deposition-process material in gaseous form provided initially may be maintained at a partial pressure suitable for causing the condensation or deposition during the forming of the layer 60 of the deposition-process material. The partial pressure may, for example, be substantially equal to the saturation vapour pressure of the deposition-process material. In an embodiment, condensation is promoted by cooling the substrate W below ambient temperature. In another embodiment, condensation on a substrate W at room temperature is achieved by providing the gaseous deposition-process material at a temperature above ambient temperature (see below).

In a subsequent step S3, a selected portion of the layer 60 of deposition-process material is irradiated, as depicted schematically in FIG. 9. The irradiation 24 modifies the deposition-process material in the selected portion (e.g. to form the modified molecules 56 in FIG. 9). A range of different modifications may be applied. In some embodiments, the irradiation of the selected portion increases a strength of adsorption of particles (e.g. the modified molecules 56 in FIG. 9) derived from the deposition-process material to the substrate W. In some embodiments, the irradiation of the selected portion induces cross-linking between particles (e.g. the modified molecules 56 in FIG. 9) derived from the deposition-process material. The irradiation thus provides material that is more resistant to removal than unmodified material outside of the selected portion. The irradiation thus locally drives a deposition process involving the deposition-process material (e.g. as a precursor material).

In a subsequent optional step S4, un-modified deposition-process material in a portion of the layer 60 of deposition-process material outside of the selected portion is evaporated (to transform the deposition-process material from a liquid state to a gaseous state) or sublimated (to transform the deposition-process material from a solid state to a gaseous state). The deposition-process material in gaseous form may be maintained at a pressure substantially below the saturation vapour pressure of the deposition-process material during the evaporation or sublimation of the un-modified deposition-process material. The evaporation or sublimation leaves behind a layer of solid material in a pattern defined by the selected portion. No additional steps for removing material outside of the selected portion are thus needed.

Thus, the environment control system 42 in the example of FIG. 5 may be configured to control the partial pressure of the deposition-process material to control (e.g. by increasing the partial pressure) whether the deposition-process material is driven to condense or deposit onto the substrate W (e.g. during step S2) or whether the deposition-process material is driven to evaporate or sublimate and thereby leave the substrate W (e.g. during step S4).

The layer of solid material is provided in a pattern in a radiation-induced deposition process involving the deposition-process material. Layers of solid material may be formed in a wide range of compositions using this approach. As discussed above with reference to FIGS. 10-14, the approach has been discovered, however, to be particularly effective in the case where the deposition-process material contains a source of carbon and the layer of solid material left behind in the pattern comprises carbon.

In an embodiment, the forming of the layer 60 of the deposition-process material (step S2) is at least partly achieved by applying a cooling process to the substrate W to maintain the substrate W below an ambient temperature (e.g. room temperature or 298K). The substrate W may be maintained at least 5 degrees, optionally at least 10 degrees, optionally at least 20 degrees, optionally at least 40 degrees, optionally at least 60 degrees, optionally at least 100 degrees, less than ambient temperature. The choice of temperature may depend on the vapour pressure versus temperature curve of the deposition-process material. For a given partial pressure, this curve determines the onset temperature for condensation. The temperature of the substrate W is then selected to be below this onset temperature. The cooling of the substrate W drives condensation or deposition of the gaseous deposition-process material onto the substrate W (or formation of a high-density gaseous layer). Gaseous molecules are cooled by contact with the substrate W and transition to the liquid or solid state (or to the high-density gaseous state). The cooling of the substrate W makes it possible to provide the gaseous deposition-process material at a partial pressure that is lower than the saturation vapour pressure of the deposition-process material at ambient temperature. The cooling of the substrate W means that the deposition-process material will condense or deposit preferentially on the substrate W relative to other elements with which the gaseous deposition-process material may be in contact, thereby reducing or eliminating unwanted contamination of other elements (e.g. optical elements) by condensation or deposition of the deposition-process material onto them. In an embodiment, as depicted schematically in FIG. 5, in an apparatus 40 for performing the method the cooling may be performed by a substrate cooling system 64. The substrate cooling system 64 may be formed within a substrate table WT configured to support the substrate W within the environment control system 42. The substrate cooling system 64 may provide the cooling in various ways, including for example using Peltier elements or by driving a cooling liquid through channels in the substrate table WT. In an embodiment, the substrate table WT further comprises a substrate heating system or the substrate cooling system may be configured to also be capable of heating the substrate (e.g. by driving an electrical current through a resistive element to cause Joule heating, via Peltier elements, or by driving a heating liquid through channels in the substrate table WT). The substrate heating system may be used to heat the substrate W during the evaporation or sublimation of the un-modified deposition-process material (in step S4). In a further embodiment, one or more elements other than the substrate (e.g. optical elements) are heated above ambient temperature during the forming of the layer 60 of deposition-process material by condensation or deposition (in step S2), thereby reducing or eliminating unwanted condensation or deposition-process material onto them.

In an embodiment, the forming of the layer 60 of the deposition-process material is at least partly achieved by providing the deposition-process material at a temperature above ambient temperature. In the example apparatus 40 of FIG. 5, the environment control system 42 supplies the deposition-process material to the environment 44 above the substrate W in gaseous form at a temperature above ambient temperature. The gaseous deposition-process material at elevated temperature may be provided by the materials exchange system 48 under control of the control system 66. The temperature difference between the gaseous deposition-process material and the substrate W again drives the condensation or deposition of the deposition-process material to form the layer 60, but in this case the substrate W does not need to be cooled. This approach avoids the need to complicate the structure of the substrate table WT by providing a substrate cooling system 64 while still allowing the layer 60 to be formed efficiently.

The embodiments may further be described using the following clauses:

1. A method of forming a patterned layer of material, comprising:
   providing a deposition-process material in gaseous form;
   forming a layer of the deposition-process material on the substrate by causing condensation or deposition of the gaseous deposition-process material; and
   irradiating a selected portion of the layer of deposition-process material to modify the deposition-process material in the selected portion.
2. The method of clause 1, wherein the forming of the layer of the deposition-process material is at least partly achieved by applying a cooling process to the substrate to maintain the substrate below an ambient temperature.
3. The method of any preceding clause, wherein the forming of the layer of the deposition-process material is at least partly achieved by providing the deposition-process material at a temperature above ambient temperature.
4. The method of any preceding clause, further comprising evaporating or sublimating un-modified deposition-process material in a portion of the layer of deposition-process material outside of the selected portion to leave behind a layer of solid material in a pattern defined by the selected portion.
5. The method of clause 4, wherein:
   the deposition-process material in gaseous form is maintained at a partial pressure substantially equal to the saturation vapour pressure of the deposition-process material during the forming of the layer of the deposition-process material; and
   the deposition-process material in gaseous form is maintained at a partial pressure substantially below the saturation vapour pressure of the deposition-process material during the evaporation or sublimation of the un-modified deposition-process material.
6. A method of forming a patterned layer of material, comprising:
   providing a substrate in a chamber;
   supplying a gas of deposition-process material to the chamber at a temperature higher than the substrate, a temperature difference between the substrate and the gas being such as to cause a high-density gaseous layer of deposition-process material to form next to the substrate, the high-density gaseous layer of deposition-process material having a higher density than the gas of deposition-process material in other regions of the chamber; and
   irradiating a selected portion of the layer of deposition-process material to modify the deposition-process material in the selected portion.
7. The method of any preceding clause, wherein the irradiation of the selected portion is performed using radiation having a wavelength of less than 100 nm.
8. The method of any preceding clause, wherein the irradiation of the selected portion is performed using an electron beam.
9. The method of clause 7 or 8, wherein the irradiation of the selected portion further uses one or more of the following: radiation having a wavelength in the range of 100 nm to 400 nm; and laser radiation.
10. The method of any preceding clause, wherein the deposition-process material comprises a precursor material for a deposition process.
11. The method of clause 10, wherein the deposition process is locally driven by the irradiation in the selected portion.
12. The method of any preceding clause, wherein the irradiation of the selected portion increases a strength of adsorption of particles derived from the deposition-process material to the substrate.
13. The method of any preceding clause, wherein the irradiation of the selected portion induces cross-linking between particles derived from the deposition-process material.
14. A method of forming a semiconductor device, comprising using the method of any preceding clause to form at least one layer in the device.
15. An apparatus for forming a patterned layer of material, comprising:
    an environment control system configured to control the composition of an environment above a substrate;
    an irradiation system; and
    a control system configured to control the environment control system and the irradiation system to: form a layer of a deposition-process material on the substrate by causing condensation or deposition of the deposition-process material from a gas; and
    irradiate a selected portion of the formed layer of deposition-process material to modify the deposition-process material in the selected portion.
16. The apparatus of clause 15, wherein the control system is further configured to provide the deposition-process material at a temperature above the ambient temperature.
17. The apparatus of clause 15 or 16, wherein the control system is further configured to control the environment control system to: evaporate or sublimate un-modified deposition-process material in a portion of the layer of deposition-process material outside of the selected portion to leave behind a layer of solid material in a pattern defined by the selected portion.
18. the apparatus of clause 17, wherein the control system is further configured to maintain the deposition-process material in gaseous form at a partial pressure substantially equal to the saturation vapour pressure of the deposition-process material during the forming of the layer of the deposition-process material; and to maintain the deposition-process material in gaseous form at a partial pressure substantially below the saturation vapour pressure of the deposition-process material during the evaporation or sublimation of the un-modified deposition-process material.

19. An apparatus for forming a patterned layer of material, comprising:
    an environment control system configured to control the composition of an environment above a substrate in a chamber;
    an irradiation system; and
    a control system configured to control the environment control system and the irradiation system to: supply a gas of deposition-process material to the chamber at a temperature higher than the substrate, a temperature difference between the substrate and the gas being such as to cause a high-density gaseous layer of deposition-process material directly to form next to the substrate, the high-density gaseous layer of deposition-process material having a higher density than the gas of deposition-process material in other regions of the chamber; and
    irradiate a selected portion of the formed layer of deposition-process material to modify the deposition-process material in the selected portion.
20. The apparatus of any of clauses 15 to 19, wherein the irradiation system is configured for irradiating the selected portion using radiation having a wavelength of less than 100 nm.
21. The apparatus of any of clauses 15 to 19, wherein the irradiation system is configured for irradiating the selected portion using an electron beam.
22. The apparatus of any of clauses 20 to 21, wherein the irradiation system is configured for irradiating the selected portion using one or more of the following: radiation having a wavelength in the range of 100 nm to 400 nm; and laser radiation
23. The apparatus of any of the clauses 15 to 22, wherein the environmental control system is configured to supply a precursor material for a deposition process.
24. The apparatus of clause 23, wherein the precursor material is selected to locally drive the deposition process by irradiation of the selected portion.

In any of the above-described methods of forming a patterned layer of material, the patterned layer of material may comprise final material that will be present in the device being manufactured (e.g. an IC device). The final material may, for example, comprise a two-dimensional material, such as one or more of the following: graphene, hexagonal boron nitride (hBN), and transition metal dichalcogenides (TMD). Alternatively or additionally, the patterned layer of material can comprise an auxiliary pattern that will contribute functionally to one or more subsequent manufacturing steps. In an embodiment, the auxiliary material functions as a hard mask (when formed from amorphous C for example). In an embodiment, the auxiliary material functions as a material enhancing photo-electron yield (when comprising Sn, In and/or one or more of their compounds for example). In an embodiment, the auxiliary material functions as a precursor and/or co-reactant and/or catalyst (e.g. metals and their compounds) for one or more subsequent deposition steps. For example, in an embodiment the auxiliary material can be $MoO_2$ or Mo, deposited according to any of the embodiments described herein, followed by sulfidation in the same chamber or in a different chamber, e.g. according to one of the following chemical reactions: $MoO_2+2H_2S \rightarrow MoS_2+2H_2O$ or $Mo+2H_2S \rightarrow MoS_2+2H_2$.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:
1. A method of forming a patterned layer of material, the method comprising:
    providing a deposition-process material in gaseous form;
    forming a layer of the deposition-process material on a substrate by causing condensation or deposition of the gaseous deposition-process material; and
    irradiating a selected portion of the layer of deposition-process material to modify the deposition-process material in the selected portion.
2. The method of claim 1, wherein the forming of the layer of the deposition-process material is at least partly achieved by applying a cooling process to the substrate to maintain the substrate below an ambient temperature.
3. The method of claim 1, wherein the forming of the layer of the deposition-process material is at least partly achieved by providing the deposition-process material at a temperature above ambient temperature.
4. The method of claim 1, further comprising evaporating or sublimating un-modified deposition-process material in a portion of the layer of deposition-process material outside of the selected portion to leave behind a layer of solid material in a pattern defined by the selected portion.
5. The method of claim 4, wherein:
    the deposition-process material in gaseous form is maintained at a partial pressure substantially equal to the saturation vapour pressure of the deposition-process material during the forming of the layer of the deposition-process material; and
    the deposition-process material in gaseous form is maintained at a partial pressure substantially below the saturation vapour pressure of the deposition-process material during the evaporation or sublimation of the un-modified deposition-process material.
6. The method of claim 1, wherein the irradiation of the selected portion is performed using radiation having a wavelength of less than 100 nm.
7. The method of claim 6, wherein the irradiation of the selected portion further uses radiation having a wavelength in the range of 100 nm to 400 nm and/or laser radiation.
8. The method of claim 1, wherein the irradiation of the selected portion is performed using an electron beam.
9. The method of claim 1, wherein the deposition-process material comprises a precursor material for a deposition process.
10. The method of claim 9, wherein the deposition process is locally driven by the irradiation in the selected portion.
11. A method of forming a semiconductor device, the method comprising using the method of claim 1 to form at least one layer in the device.
12. An apparatus for forming a patterned layer of material, the apparatus comprising:
    an environment control system configured to control the composition of an environment above a substrate;
    an irradiation system; and a control system configured to control the environment control system and the irradiation system to at least:
form a layer of a deposition-process material on the substrate by causing condensation or deposition of the deposition-process material from a gas; and
irradiate a selected portion of the formed layer of deposition-process material to modify the deposition-process material in the selected portion.

13. The apparatus of claim 12, wherein the control system is further configured to control the environment control system to evaporate or sublimate un-modified deposition-process material in a portion of the layer of deposition-process material outside of the selected portion to leave behind a layer of solid material in a pattern defined by the selected portion.

14. The apparatus of claim 13, wherein the control system is further configured to maintain the deposition-process material in gaseous form at a partial pressure substantially equal to the saturation vapour pressure of the deposition-process material during the forming of the layer of the deposition-process material; and to maintain the deposition-process material in gaseous form at a partial pressure substantially below the saturation vapour pressure of the deposition-process material during the evaporation or sublimation of the un-modified deposition-process material.

15. The apparatus of claim 12, further comprising a substrate cooling system configured to maintain the substrate below an ambient temperature.

16. The apparatus of claim 12, wherein the irradiation system is configured for irradiating the selected portion using radiation having a wavelength of less than 100 nm or using an electron beam.

17. The apparatus of claim 12, wherein the environmental control system is configured to supply a precursor material for a deposition process.

18. An apparatus for forming a patterned layer of material, the apparatus comprising:
an environment control system configured to control the composition of an environment above a substrate in a chamber;
an irradiation system; and
a control system configured to control the environment control system and the irradiation system to at least:
supply a gas of deposition-process material to the chamber at a temperature higher than the substrate, a temperature difference between the substrate and the gas being such as to cause a high-density gaseous layer of deposition-process material directly to form next to the substrate, the high-density gaseous layer of deposition-process material having a higher density than the gas of deposition-process material in other regions of the chamber; and
irradiate a selected portion of the formed layer of deposition-process material to modify the deposition-process material in the selected portion.

19. The apparatus of claim 18, wherein the irradiation system is configured for irradiating the selected portion using radiation having a wavelength of less than 100 nm or using an electron beam.

20. The apparatus of claim 18, wherein the environmental control system is configured to supply a precursor material for a deposition process.

* * * * *